(12) United States Patent
Cremer et al.

(10) Patent No.: US 7,880,268 B2
(45) Date of Patent: Feb. 1, 2011

(54) MIM CAPACITOR

(75) Inventors: Sébastien Cremer, Sassenage (FR); Cédric Perrot, Saint-Martin-d'Heres (FR); Claire Richard, Crolles (FR)

(73) Assignee: STMicroelectronics S.A., Montrouge (FR)

(*) Notice: Subject to any disclaimer, the term of this patent is extended or adjusted under 35 U.S.C. 154(b) by 150 days.

(21) Appl. No.: 11/746,177

(22) Filed: May 9, 2007

(65) Prior Publication Data

US 2007/0275536 A1 Nov. 29, 2007

(30) Foreign Application Priority Data

May 12, 2006 (FR) .................................. 06 51723

(51) Int. Cl.
*H01L 49/02* (2006.01)
*H01L 21/64* (2006.01)

(52) U.S. Cl. .............................. 257/532; 257/E21.019; 257/E23.144; 257/E27.113; 438/387

(58) Field of Classification Search ................. 257/532, 257/304, 307, 311, E21.019, E23.144, E27.113; 438/396, 386–387
See application file for complete search history.

(56) References Cited

U.S. PATENT DOCUMENTS

| 5,150,276 | A | * | 9/1992 | Gonzalez et al. ............ 361/313 |
|---|---|---|---|---|
| 5,661,064 | A | * | 8/1997 | Figura et al. ................. 438/396 |
| 5,789,818 | A | * | 8/1998 | Havemann .................... 257/750 |
| 6,222,218 | B1 | | 4/2001 | Jammy et al. |
| 6,320,244 | B1 | | 11/2001 | Alers et al. |
| 6,410,955 | B1 | * | 6/2002 | Baker et al. .................. 257/307 |
| 6,468,873 | B1 | * | 10/2002 | Liu et al. ...................... 438/387 |
| 6,486,529 | B2 | * | 11/2002 | Chi et al. ...................... 257/531 |
| 6,646,323 | B2 | * | 11/2003 | Dirnecker et al. ............ 257/532 |
| 6,750,495 | B1 | | 6/2004 | Alers et al. |
| 6,853,024 | B1 | | 2/2005 | Tu |
| 6,992,344 | B2 | * | 1/2006 | Coolbaugh et al. ........... 257/301 |
| 6,992,368 | B2 | * | 1/2006 | Volant et al. ................. 257/532 |
| 7,312,131 | B2 | * | 12/2007 | Wu ............................. 438/397 |
| 7,402,889 | B2 | * | 7/2008 | Park ............................ 257/532 |
| 2001/0039087 | A1 | | 11/2001 | Jammy et al. |
| 2004/0245558 | A1 | | 12/2004 | Manger |
| 2006/0234443 | A1 | * | 10/2006 | Yang et al. ................... 438/253 |

OTHER PUBLICATIONS

International Search Report from a corresponding French Application No. 0651723, filed May 12, 2006.

* cited by examiner

*Primary Examiner*—Mary Wilczewski
*Assistant Examiner*—Toniae M Thomas
(74) *Attorney, Agent, or Firm*—Lisa K. Jorgenson; James H. Morris; Wolf, Greenfield & Sacks, P.C.

(57) ABSTRACT

A method for forming a MIM-type capacitor by filling of trenches by conformal depositions of insulating materials and of conductive materials, two successive electrodes of the capacitor including on either side of a thin vertical insulating layer at least one conductive layer of same nature, including the step of lowering the level of the conductive layers with respect to the level of the insulating layer separating them.

17 Claims, 2 Drawing Sheets

MIM CAPACITOR

BACKGROUND OF THE INVENTION

1. Field of the Invention

The present invention relates to the forming of capacitors of metal-insulator-metal type (MIM) in metallization levels of interconnection of semiconductor circuits.

2. Discussion of the Related Art

Capacitors having a capacitance on the order of from 5 to 50 fF/μm2 are more and more often directly formed in the metallization interconnect levels of the semiconductor circuits with which they are associated, rather than outside of such circuits. Such capacitors are intended to filter a signal with respect to a power supply, to form filters, to form an analog-to-digital converter, to form a voltage-controlled oscillator, or in radio-frequency applications. Such MIM capacitors may also be used as a memory point of memory devices.

FIGS. 1, 2, 3, and 4 illustrate different steps of manufacturing of a capacitor according to a known method. FIG. 1 is a cross-section view. FIG. 2 is a top view. FIG. 3 is an enlarged view of a portion of FIG. 1. FIG. 4 is a cross-section view at a step subsequent to those illustrated in FIG. 1.

As illustrated in FIG. 1, the capacitor-forming method starts with the forming, in a first thick interlevel dielectric layer 1, of a metal electrode 3. A second thick interlevel dielectric layer 5 is deposited over layer 1 and electrode 3 altogether. Layer 5 is generally formed of a first relatively thin insulating sub-layer 51 and of a thick layer 52 of an insulator that may be selectively etched with respect to first sub-layer 51. Sub-layer 51 is itself selectively etchable with respect to underlying layer 1. Typically, sub-layer 51 is a silicon nitride sub-layer (Si3N4) while layer 1 and sub-layer 52 are made of silicon oxide (SiO2). Then, layer 5 is selectively opened to expose first electrode 3 according to a predetermined pattern. For example, as illustrated in the top view of FIG. 2, parallel trenches 21 are dug into layer 5, five trenches of which are shown in cross-section view in FIG. 1 and in top view in FIG. 2. Trenches 21 are interconnected by a common perpendicular trench 22. Then, trenches 21, 22 are filled by successive conformal depositions of a thin metal layer 7, of an interelectrode insulator 8, of another thin metal layer 9. A conductive layer 11 fills trenches 21 and 22. Thin layer 7 is intended to increase the surface area of electrode 3 across the thickness of interlevel layer 5. Layer 11 is generally formed of polysilicon, of copper, of a copper-based alloy or any other conductive material.

FIG. 3 illustrates an enlarged cross-section view of FIG. 1 at the level of a trench 21 (FIG. 2). Conductive layers 7 and 9 are generally formed of respective sub-layers 71, 72 and 91, 92. Sub-layers 71 and 92 are generally identical and are intended to ensure a proper adherence between electrode sub-layers 72 and 91 and conductive layer 3 or 11, generally made of copper. Sub-layers 72 and 91, which are on either side of insulator 8 interposed between the electrodes, are also generally identical and are selected to ensure optimal electric performances. In particular, sub-layers 72 and 91 are selected to minimize the migration of the species forming them in the dielectric forming insulator 8. In addition, sub-layers 72 and 91 are selected to minimize the migration of the species forming insulator 8 in sub-layers 72 and 91. Typically, sub-layers 71, 72, 91, and 92 have a respective thickness of approximately 10 nm. Electrode sub- layers 71 and 92 are typically made of tantalum nitride (TaN). Sub-layers 72 and 91 are typically made of titanium nitride (TiN). Interelectrode dielectric 8 has an approximate thickness from 15 to 50 nm, for example, 30 nm, and is typically made of silicon nitride or tantalum oxide (Ta2O5).

After the depositions of layers 7, 8, 9, and 11, these layers are removed from the surface of layer 5 to only be kept in trenches 21 and 22 of FIG. 2. For this purpose, a chem.-mech. polishing, CMP, is generally performed.

At the next steps, as illustrated in the cross-section view of FIG. 4, a new interlevel dielectric layer 15 generally formed of a first thin sub-layer 151 typically made of silicon nitride and of a second thick sub-layer 152 typically made of silicon oxide is deposited over the entire structure.

The method then carries on with steps, not shown, aiming at completing the structure by the forming of contacts with lower electrode 3-7 and with upper electrode 9-11. It should be noted that an upper mechanical electrode 60 illustrated in dotted lines in FIG. 2 is frequently formed in layer 15.

A disadvantage of the above-described method lies in the fact that the resulting capacitors have relatively high leakage currents and this, randomly, between electrodes 9-11 and 7-3. Thus, the leakage currents for a 5-V voltage difference are greater than 10-6 A/cm2. Further, the capacitors have breakdown voltages randomly distributed across a wide range between 10 and 25 volts. Such variations are said to be random since these intervals not only appear between two capacitors formed in different wafers, but also between capacitors formed in a same wafer.

SUMMARY OF THE INVENTION

The present invention aims at providing a method for manufacturing MIM capacitors which overcomes the disadvantages of known methods.

The present invention also features providing such a method which provides MIM capacitors which exhibit breakdown voltages with a reduced distribution.

The present invention features providing such a method which provides MIM capacitors which exhibit leakage currents having a substantially stable value lower than 10-6 A/cm2.

The present invention also features providing such a method which provides MIM capacitors which exhibit a surface capacitance greater than that of known capacitors.

The present invention also features providing such a method which is simple to implement.

To achieve all or part of these objects, as well as others, the present invention provides a method for forming a MIM-type capacitor by filling of trenches by conformal depositions of insulating materials and of conductive materials, two successive electrodes of the capacitor comprising on either side of a thin vertical insulating layer at least one conductive layer of same nature, comprising the step of lowering the level of the conductive layers with respect to the level of the insulating layer separating them.

According to an embodiment of the present invention, the lowering is performed after complete filling of a cavity intended to receive the capacitor with the materials intended to form the electrodes with the possible exception of a metal plate intended to form a contact portion of an electrode.

According to an embodiment of the present invention, the lowering is followed by a conformal deposition of a layer of an insulating material.

According to an embodiment of the present invention, the insulating material is of same nature as the thin vertical insulating layer separating the vertical extensions of the electrodes.

The present invention also provides a MIM-type capacitor, two electrodes of the capacitor comprising on either side of a thin vertical insulating layer at least one conductive layer of same nature, the level of the conductive layers being lowered with respect to the level of the insulating layer separating them.

According to an embodiment of the present invention, the level difference between the conductive layers and the insulating layer is totally or partially compensated for by an insulating material.

According to an embodiment of the present invention, the insulating material is of same nature as the insulating layer.

The foregoing and other objects, features, and advantages of the present invention will be discussed in detail in the following non-limiting description of specific embodiments in connection with the accompanying drawings.

DETAILED DESCRIPTION

Figure 1:
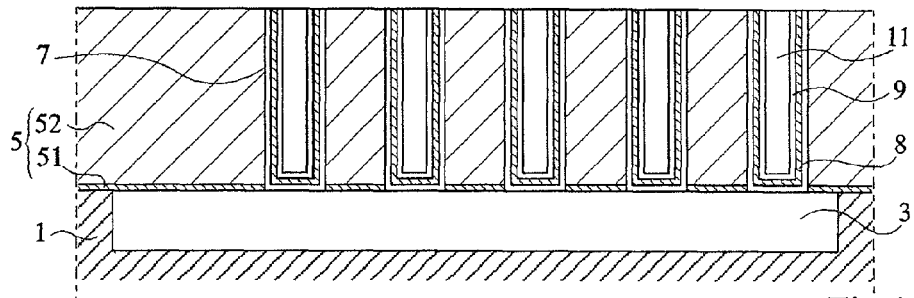
FIG. 1, previously described, illustrates in cross-section view a MIM capacitor at an intermediary step of its manufacturing according to a known method.

For clarity, the same elements have been designated with the same reference numerals in the different drawings. Further, as usual in the representation of semiconductor circuits, the various drawings are not to scale.

The present invention advantageously takes advantage of the studies made by the present inventors on the behavior of MIM capacitors obtained by the known method described in relation with FIGS. 1 to 4. In particular, the present inventors have succeeded in determining that current leakages originate from the perimeter of the capacitors, at the surface of the filled trenches.

By more precisely studying the structure, they have reached the conclusion that, in the chem.-mech. polishing, residues of the metallic materials of layers 72 and 91 located on either side of interelectrode insulator 8 come into contact and form a short-circuit.

Figure 2:
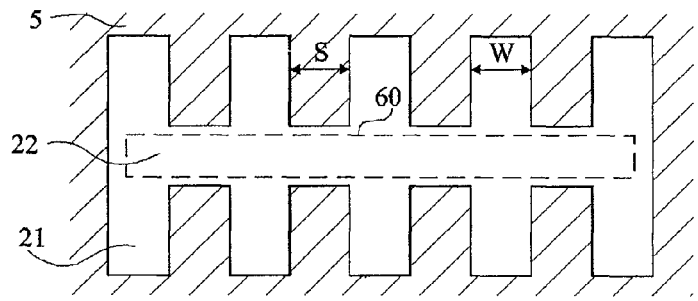
FIG. 2, previously described, illustrates in top view another step of manufacturing of a capacitor according to the known method.
Figure 3:
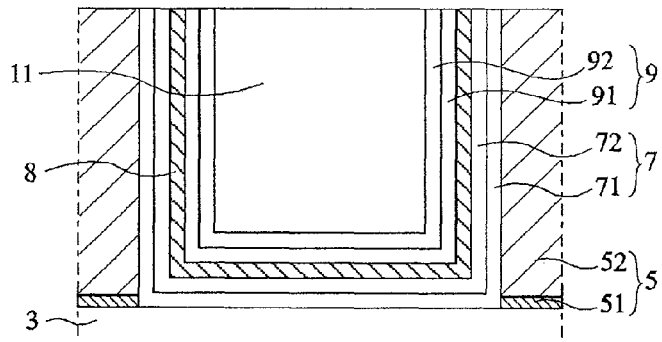
FIG. 3, previously described, is an enlarged cross-section view of a portion of FIG. 1.
Figure 4:
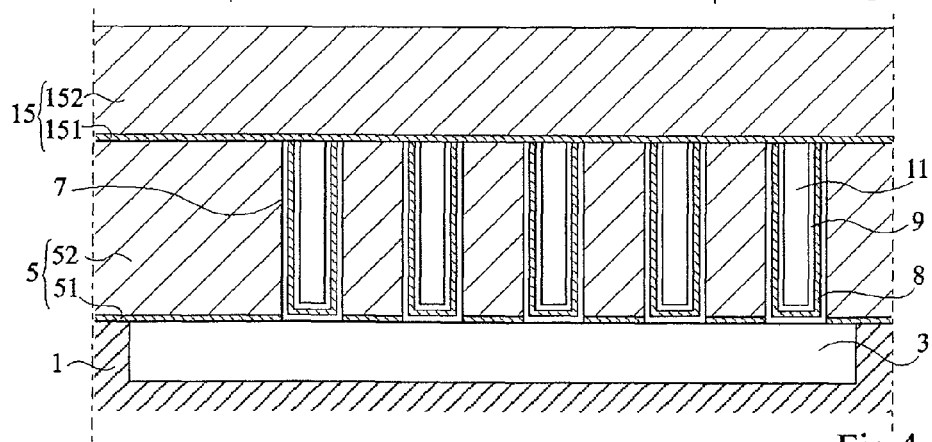
FIG. 4, previously described, illustrates another intermediary step of the manufacturing of a capacitor according to the known method.

A method according to the present invention starts with capacitor-forming steps similar to those previously described in relation with FIGS. 1, 2, and 3 comprising the filling of trenches 21-22 by means of successive metallic and insulating materials 7, 8, 9, and 11, followed by a chem.-mech. polishing.

Figure 5:
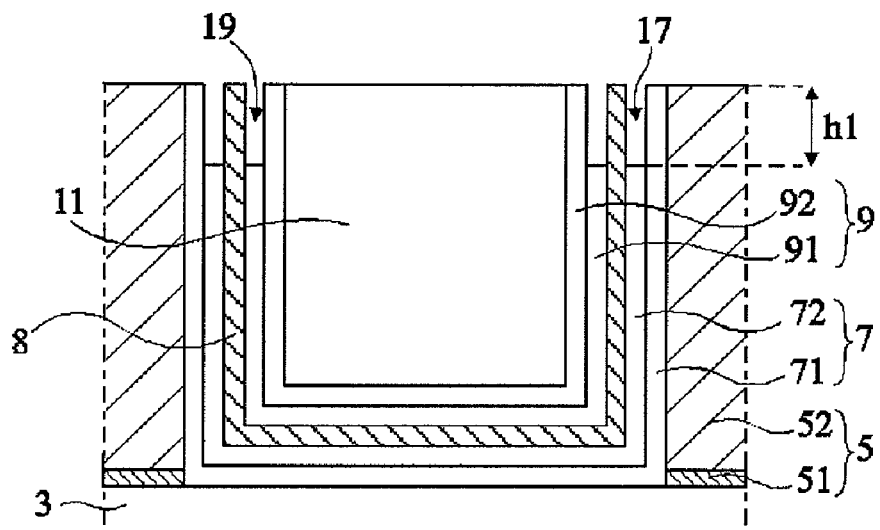
FIG. 5 illustrates, in cross-section view, a step of a method for manufacturing a MIM capacitor according to the present invention.

FIG. 5 illustrates steps implemented according to a method according to the present invention after the CMP polishing, the result of which is illustrated in FIG. 3. For clarity, only the differences between FIG. 3 and FIG. 5 are described hereafter.

After implementation of the CMP polishing, a specific etch step is implemented. This etch is capable of etching the sole conductive sub-layers 72 and 91 located on either side of the interelectrode insulator 8, left intact. The etch is preferably capable of leaving intact the sub-layers of same nature 92 and 71 of the first and second electrodes as well as interlevel and interelectrode insulators 5 and 8. Openings 17 and 19 respectively delimited by the sub-layer 71 and 92 left in place are thus formed on either side of insulator 8.

Figure 6:
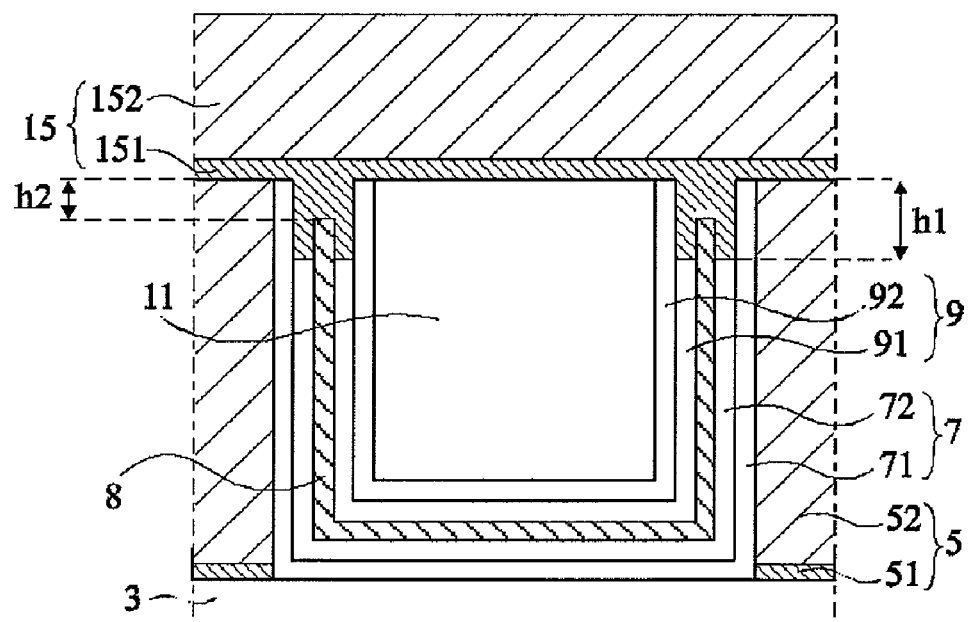
FIG. 6 illustrates, in cross-section view, another step of the method for manufacturing a MIM capacitor according to the present invention.

Then, as illustrated in FIG. 6, interlevel layer 15 is deposited. On deposition of layer 15, first sub-layer 151 deposits on either side of interelectrode insulator 8 and partially or totally fills openings 17 and 19.

The method carries on with any appropriate step of forming of the capacitors and of the interconnects of the underlying semiconductor circuits, not shown.

As an example, the partial removal of titanium nitride sub-layers 72 and 91 is performed by chemical etching by means of a water, hydrogen peroxide (H2O2), and ammonia (ammonium hydroxide NH4OH) solution.

According to an embodiment, after etching of the electrodes and before the deposition of the interlevel sub-layer 151, a cleaning with hydrofluoric acid (HF) is performed. During this last cleaning, the interelectrode insulator 8 generally formed of silicon nitride or tantalum oxide is etched, removed over a height h2 as shown in FIG. 6. Such an etching is lighter than the removing of the electrode sub-layers 72 and 91 so that h2 is smaller than h1. The removing h2 of the interelectrode insulator 8 only occurs in cavities 17 and 19. This etching of the interelectrode insulator 8 is then compensated for by the deposition of insulating sub-layer 151. Such an etching has an improving effect upon the performance of the obtained capacitor. Indeed, as stated above, the insulating sub-layer 151 is typically made of silicon nitride. It is known that while depositing silicon nitride, the first few angstroms of the layer are silicon rich. Due to the thin wideness of the cavities 17 and 19, as the upper surface of the interelectrode insulator 8 reaches the same level as the neighboring electrodes, the sub-layer 151 forms an arch between the second electrode conductors 11 or 92 and the first electrode conductor 71. The first few Si-rich angstroms of such an arch are conductive and allow a leakage current to flow. In practice, such an arch is made of two arches, a first one extending from the external electrode 71 to the middle pillar constituted by the interelectrode insulator 8 and a second arch extending from the pillar made of the interelectrode insulator 8 and the internal electrode 11-92. Recessing according to the present embodiment the interelectrode insulator 8 allows avoiding the formation of the conductive arch while depositing the silicon nitride sub-layer 151. The leakage current of the resulting capacitor is reduced.

Thus, for a total height of interlevel layer 5 of approximately 650 nm, after having removed a height h1 from 40 to 100 nm of sub-layers 91 and 72 and a height h2 from 10 to 50 nm of interelectrode insulator 8 with h2 being smaller than h1, for a 5-V voltage applied between electrodes 3-7 and 11-9, leakage current densities lower than $10^{-8}$ A/cm² can be observed. Such a leakage level is negligible and is lower by a at least a factor 100 with respect to known devices. Further, when the dimensions, in particular width w (FIG. 2) of trenches 21 and width s of the space separating two neighboring trenches, are decreased, this value remains substantially steady.

Further, the distribution of the breakdown voltages of the obtained capacitors is narrowed with respect to that of known capacitors. Thus, the breakdown voltage variation range extends from 15 to 25 V. Further, the breakdown voltage is substantially homogeneous for same heights h1 and h2 of removal of sub-layers 72 and 91, and interelectrode insulator, respectively.

Such improvements of the electric performances with respect to those of known capacitors are further obtained with no notable complication of the manufacturing process. In particular, they are obtained without use of an additional mask. Such improvements are indeed obtained by only implementing etch steps of layers 72 and 91 and of insulator 8. Such steps are self-aligned. Further cavities 17 and 19 are partially or totally filled without implementing specific steps but by using the deposition of the superposed interlevel insulator 15.

Of course, the present invention is likely to have various alterations, modifications, and improvements which will readily occur to those skilled in the art. In particular, only those steps necessary to the understanding of the present invention have been described. Thus, it will be within the abilities of those skilled in the art to form, if necessary, contacts with electrodes 3-7 and/or 9-11 and possibly form these contacts simultaneously to the forming of the capacitors or other interconnects.

Further, the implementation of the present invention is not limited to a given capacitor shape. Thus, the electrodes may be formed simultaneously, each of them being comb-shaped and the teeth of such combs being interdigited. For this purpose, separate trenches having the desired shape may for example be formed, before deposition of the electrode layers simultaneously in all the trenches, a CMP polishing may be implemented to individualize each electrode in a respective trench and the removal according to the present invention may be performed before depositing an insulating layer intended to fill the cavities formed by the removal.

Moreover, the removal according to the present invention is not limited to the sole sub-layers 72 and 91, but may also be implemented for sub-layers 71 and 92.

Besides, it will be within the abilities of those skilled in the art to bring any material and thickness modification necessary in a given technological process. Thus, the interelectrode insulating material of layer 8 will be adapted to the etch selectivity constraints of sub-layers 72 and 91 and to the desired electric performance. Similarly, it will be within the abilities of those skilled in the art to adapt the used conductive materials to the used technological process, in particular the material of sub-layers 72 and 91 to the previously-described etch selectivity constraints.

It should be noted by those skilled in the art that the nature of the semiconductor circuits in the metallization levels of which the capacitors are formed has not been described in detail and that it may be of any type.

Further, although the present invention has been described in the context of a silicon process, it applies to any semiconductor circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a MIM-type capacitor by filling of trenches by conformal depositions of insulating materials and of conductive materials, two successive electrodes of the capacitor comprising on either side of a thin vertical insulating layer at least one conductive layer of a same material, comprising polishing the electrodes and the thin vertical insulating layer to a first level, and after the polishing, the step of lowering the level of said conductive layers with respect to the level of the insulating layer separating them, and after lowering the level of said conductive layers, a step of lowering the level of the insulating layer with respect to a neighboring thick interlevel insulator.

2. The method of claim 1, wherein the step of lowering the level of said conductive layers is performed after complete filling of a cavity intended to receive the capacitor with the materials intended to form the electrodes.

3. The method of claim 1, wherein the lowering of the level of the insulating layer is followed by a conformal deposition of a layer of an insulating material.

4. The method of claim 3, wherein the insulating material is of a same material as the thin vertical insulating layer separating the vertical extensions of the electrodes.

5. A MIM-type capacitor having two electrodes comprising on either side of a thin vertical insulating layer at least one conductive layer of a same material, wherein the level of the conductive layers is below the level of the insulating layer separating them, wherein the level of the insulating layer is below the level of a surrounding interlevel insulating thick layer, wherein the conductive layers are formed in a trench.

6. The capacitor of claim 5, wherein the level difference between the conductive layers and the insulating layer is totally or partially compensated for by an insulating material.

7. The capacitor of claim 6, wherein the insulating material is of a same material as the insulating layer.

8. A method of forming a MIM capacitor in a trench of an interlevel dielectric layer, the method comprising:
    forming a first metal layer in the trench such that the first metal layer conforms to the trench;
    forming a dielectric layer in the trench such that the dielectric layer conforms to the first metal layer;
    forming a second metal layer in the trench such that the second metal layer conforms to the dielectric layer;
    removing top portions of the first and second metal layers so that uppermost portions of the first and second metal layers are below an upper surface of the interlevel dielectric layer; and
    removing a top portion of the dielectric layer so that an uppermost portion of the dielectric layer is below the upper surface of the interlevel dielectric layer.

9. The method of claim 8, wherein the top portions of the first and second metal layers are removed prior to the top portion of the dielectric layer.

10. The method of claim 8, wherein a height of the top portions removed from the first and second metal layers is greater than a height of the top portion removed from the dielectric layer.

11. The method of claim 8, wherein the removing of the top portions of the first and second metal layers comprises removing 40-100 nm of the first and second metal layers.

12. A MIM capacitor formed in a trench of an interlevel dielectric layer, the interlevel dielectric layer having an upper surface, the MIM capacitor comprising:
    a first metal layer formed within the trench and conforming to a side of the trench;
    a dielectric layer formed within the trench to extend along a side of the first metal layer, wherein an uppermost portion of the dielectric layer is lower than the upper surface of the interlevel dielectric layer; and
    a second metal layer formed within the trench along a side of the dielectric layer, wherein an uppermost portion of the second metal layer is lower than the uppermost portion of the dielectric layer;
    wherein an uppermost portion of the first metal layer is lower than the uppermost portion of the dielectric layer.

13. The MIM capacitor of claim 12, wherein the dielectric layer is a first dielectric layer and the MIM capacitor further comprises:

a second dielectric layer that fills a region between the uppermost portions of the first dielectric layer and a level of the upper surface of the interlevel dielectric.

14. The MIM capacitor of claim 13, wherein the second dielectric layer fills regions between the uppermost portions of the first dielectric layer and the level of the upper surface of the interlevel dielectric.

15. The MIM capacitor of claim 14, wherein the second dielectric layer covers the upper surface of the interlevel dielectric layer.

16. The MIM capacitor of claim 12, wherein the uppermost portions of the first and second metal layers are below the level of the upper surface of the interlevel dielectric by between 40 nm and 100 nm.

17. The MIM capacitor of claim 12, having a leakage current density lower than $10^{-8}$ A/cm$^2$.

* * * * *